(12) United States Patent
Irobe et al.

(10) Patent No.: US 12,075,679 B2
(45) Date of Patent: Aug. 27, 2024

(54) ELECTRO-OPTICAL DEVICE AND ELECTRONIC APPARATUS

(71) Applicant: SEIKO EPSON CORPORATION, Tokyo (JP)

(72) Inventors: Jun Irobe, Chino (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 517 days.

(21) Appl. No.: 17/389,365

(22) Filed: Jul. 30, 2021

(65) Prior Publication Data

US 2022/0037416 A1   Feb. 3, 2022

(30) Foreign Application Priority Data

Jul. 30, 2020   (JP) .................................. 2020-129358

(51) Int. Cl.
*H01L 27/32* (2006.01)
*H10K 50/858* (2023.01)
*H10K 59/38* (2023.01)

(52) U.S. Cl.
CPC ........... *H10K 59/38* (2023.02); *H10K 50/858* (2023.02)

(58) Field of Classification Search
CPC ...... H10K 59/10; H10K 59/38; H10K 50/858; H10K 59/879; H10K 59/353; H10K 59/122; H10K 59/123; H10K 59/124; H10K 59/126; H10K 59/1315; H01L 27/1214; B32B 2457/202; H05K 2201/10136; G02F 1/133514; G02F 2001/136222; G09G 2300/046; G09G 2300/0473; H10B 41/27;
(Continued)

(56) References Cited

U.S. PATENT DOCUMENTS 5,324,804 A * 6/1994 Steinmann ............ C07C 43/215
526/265
2008/0278664 A1   11/2008 Okayama
(Continued)

FOREIGN PATENT DOCUMENTS

JP   H07-270772   10/1995
JP   H08-201793   8/1996
(Continued)

OTHER PUBLICATIONS

Mohammad Yasir et al., "Enhancing the Refractive Index of Polymers with a Plant-Based Pigment," 2021, Small, pp. 1-3; Fig. 2a (Year: 2021).*

*Primary Examiner* — Cuong B Nguyen
(74) *Attorney, Agent, or Firm* — JCIPRNET

(57) ABSTRACT

An electro-optical device according to the present disclosure includes a substrate, a colored layer, a first light-emitting element and a second light-emitting element disposed between the substrate and the colored layer in a thickness direction of the substrate, and a wall portion disposed between the first light-emitting element and the colored layer in the thickness direction and between the first light-emitting element and the second light-emitting element in plan view, wherein a first refractive index of the wall portion and a second refractive index of the colored layer are different from each other, and the colored layer includes a curved surface that is in contact with the wall portion and protrudes toward the wall portion.

15 Claims, 10 Drawing Sheets

(58) Field of Classification Search
CPC ........ H10B 43/27; H10B 43/10; H10B 43/50; H10B 43/35; G11C 5/025; G11C 5/147; G11C 5/148; G11C 16/30
See application file for complete search history.

(56) References Cited

U.S. PATENT DOCUMENTS

| | | | |
|---|---|---|---|
| 2015/0084026 A1* | 3/2015 | Miyamoto | H10K 50/858 |
| | | | 257/40 |
| 2018/0138245 A1 | 5/2018 | Akagawa et al. | |
| 2021/0005688 A1 | 1/2021 | Shinya et al. | |

FOREIGN PATENT DOCUMENTS

| | | | | |
|---|---|---|---|---|
| JP | 2008-281668 | | 11/2008 | |
| JP | 2013-258021 | | 12/2013 | |
| JP | 6299845 | B1 * | 3/2018 | ........... G09G 3/2003 |
| JP | 2018081798 | | 5/2018 | |
| JP | 2018088381 | | 6/2018 | |
| WO | 2019159641 | | 8/2019 | |

\* cited by examiner

ELECTRO-OPTICAL DEVICE AND ELECTRONIC APPARATUS

The present application is based on, and claims priority from JP Application Serial Number 2020-129358, filed Jul. 30, 2020, the disclosure of which is hereby incorporated by reference herein in its entirety.

BACKGROUND

1. Technical Field

The present disclosure relates to an electro-optical device and an electronic apparatus.

2. Related Art

An electro-optical device such as a display device including a light-emitting element such as an organic electroluminescence (EL) element is known.

A display device described in WO 2019/159641 includes a light-emitting element, a protective layer being a barrier layer of the light-emitting element, and a color filter disposed on the protective layer. The protective layer includes a curved surface that protrudes toward the light-emitting element. Thus, a boundary surface of the color filter with the protective layer is curved. Since the boundary surface is curved, the boundary surface functions as a condensing lens that condenses light emitted from the light-emitting element.

However, when an indentation is formed in the protective layer, a film thickness of the protective layer is reduced due to the indentation. As a result, there is a risk that a function of the protective layer for protecting the light-emitting element may be reduced. On the other hand, when a depth of the indentation formed in the protective layer is reduced in order to maintain the function of the protective layer, a curvature of a contact portion of the color filter with the protective layer is reduced. Thus, a lens function decreases. Therefore, it is difficult to improve light extraction efficiency or a visual field angle characteristic.

SUMMARY

One aspect of an electro-optical device according to the present disclosure includes a substrate, a colored layer, a first light-emitting element and a second light-emitting element disposed between the substrate and the colored layer in a thickness direction of the substrate, and a wall portion disposed between the first light-emitting element and the colored layer in the thickness direction and between the first light-emitting element and the second light-emitting element in plan view, where a first refractive index of the wall portion and a second refractive index of the colored layer are different from each other, and the colored layer includes a curved surface that is in contact with the wall portion and protrudes toward the wall portion.

One aspect of an electro-optical device according to the present disclosure includes a substrate, a wall portion disposed between two pixels adjacent to each other in plan view, a colored layer having a second refractive index different from a first refractive index of the wall portion, and a light-emitting layer disposed between the substrate and the colored layer, where the colored layer includes a curved surface that is in contact with the wall portion and protrudes toward the wall portion.

One aspect of an electronic apparatus according to the present disclosure includes the electro-optical device described above, and a control unit configured to control an operation of the electro-optical device.

DESCRIPTION OF EXEMPLARY EMBODIMENTS

Figure 1:
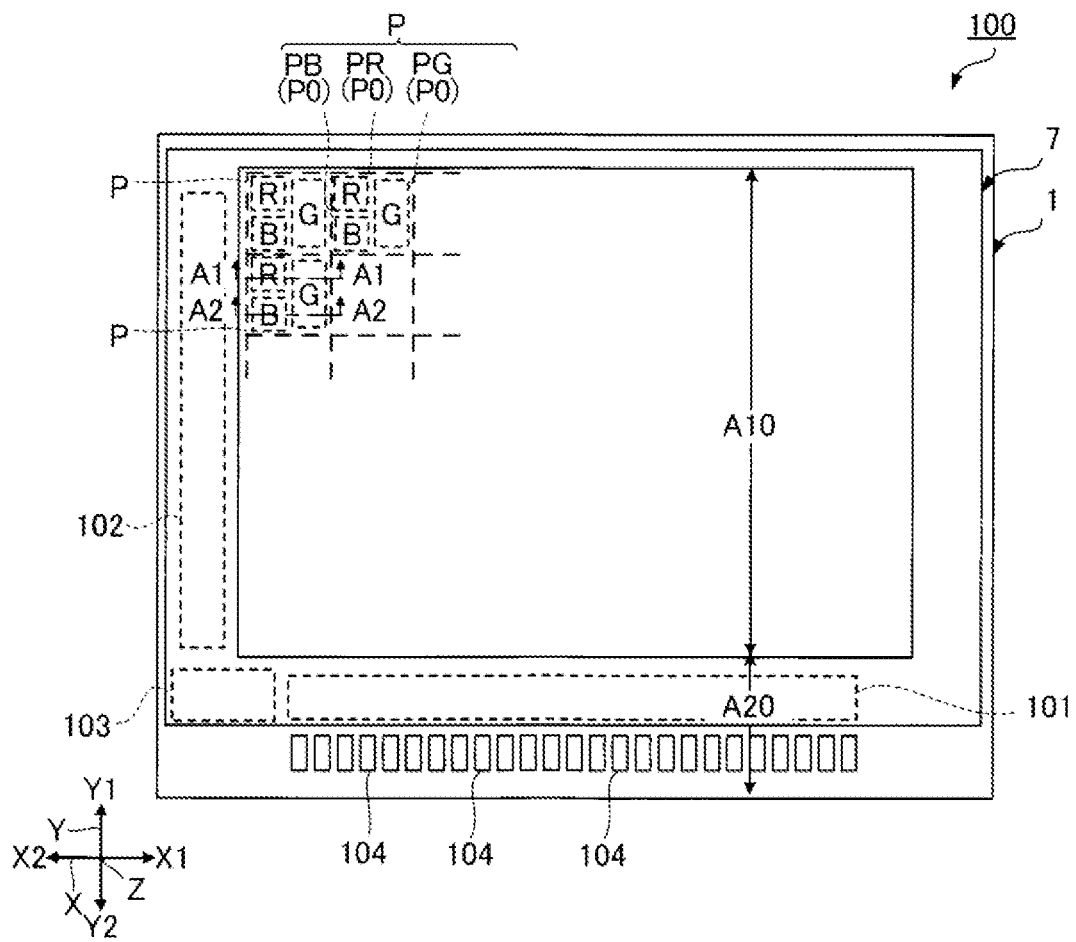
FIG. 1 is a plan view schematically illustrating an electro-optical device according to a first exemplary embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Device 100

1A. First Exemplary Embodiment

1A-1. Overall Configuration of Electro-Optical Device 100

FIG. 1 is a plan view schematically illustrating an electro-optical device 100 according to a first exemplary embodiment. Note that, for convenience of explanation, the following description will be made appropriately using an X-axis, a Y-axis, and a Z-axis orthogonal to each other. Further, it is assumed that one direction along the X-axis is taken as an X1 direction, and a direction opposite to the X1 direction is taken as an X2 direction. Similarly, it is assumed that one direction along the Y-axis is taken as a Y1 direction, and a direction opposite to the Y1 direction is taken as a Y2 direction. It is assumed that one direction along the Z-axis is taken as an Z1 direction, and a direction opposite to the Z1 direction is taken as an Z2 direction. It is assumed that viewing the electro-optical device 100 from the Z1 direction or the Z2 direction is taken as "plan view".

The electro-optical device 100 illustrated in FIG. 1 is a device configured to display a full color image by using an organic electroluminescence (EL). Note that the image includes an image that displays only character information. The electro-optical device 100 is a micro display suitably used in a head-mounted display and the like, for example.

The electro-optical device 100 includes a display region A10 in which an image is displayed, and a peripheral region A20 that surrounds the display region A10 in plan view. In the example illustrated in FIG. 1, a shape of the display region A10 in plan view is a rectangle, but the shape is not limited thereto and may be another shape.

The display region A10 includes a plurality of pixels P. Each of the pixels P is the smallest unit in display of an image. In the present exemplary embodiment, the plurality of pixels P are disposed in matrix in the X1 direction and the Y2 direction. Each of the pixels P includes a sub-pixel PR in which light in a red wavelength region is obtained, a sub-pixel PB in which light in a blue wavelength region is obtained, and a sub-pixel PG in which light in a green wavelength region is obtained. One pixel P of a color image is formed of the sub-pixel PB, the sub-pixel PG, and the sub-pixel PR. Hereinafter, when the sub-pixel PB, the sub-pixel PG, and the sub-pixel PR are not differentiated, the sub-pixel PB, the sub-pixel PG, and the sub-pixel PR are expressed as a sub-pixel P0.

Three sub-pixels P0 of the sub-pixels PB, PR, and PG are provided for each of the pixels P. The sub-pixel P0 is an element constituting the pixel P. The sub-pixel P0 is the smallest unit being independently controlled. The plurality of pixels P0 are disposed in matrix in the X1 direction and the Y2 direction. Further, in the present exemplary embodiment, an array of the sub-pixel P0 is a rectangle array. In the present exemplary embodiment, an area of the sub-pixels PG is the largest among the three sub-pixels P0 included in the pixel P.

Here, any one of the blue wavelength region, the green wavelength region, and the red wavelength region corresponds to a first wavelength region. Another wavelength region corresponds to a second wavelength region. The remaining one corresponds to a third wavelength region. Note that the first wavelength region, the second wavelength region, and the third wavelength region are wavelength regions different from each other. In the present exemplary embodiment, a case in which the red wavelength region is the first wavelength region, the blue wavelength region is the second wavelength region, and the green wavelength region is the third wavelength region is described as an example. Note that the blue wavelength region is a wavelength region shorter than the green wavelength region, and the green wavelength region is a wavelength region shorter than the red wavelength region. The red wavelength region exceeds 580 nm and is less than or equal to 700 nm. The green wavelength region is greater than or equal to 500 nm and less than or equal to 580 nm. The blue wavelength region is greater than or equal to 400 nm and less than 500 nm.

The electro-optical device 100 includes an element substrate 1 and a transmissive substrate 7 having optical transparency. The electro-optical device 100 is a so-called top-emission structure, and emits light from the transmissive substrate 7. Note that a direction in which the element substrate 1 and the transmissive substrate 7 overlap each other coincides with the Z1 direction or the Z2 direction. Further, the "optical transparency" refers to transparency with respect to visible light, and preferably means that transmittance of the visible light may be greater than or equal to 50%.

The element substrate 1 includes a data line drive circuit 101, a scanning line drive circuit 102, a control circuit 103, and a plurality of external terminals 104. The data line drive circuit 101, the scanning line drive circuit 102, the control circuit 103, and the plurality of external terminals 104 are disposed in the peripheral region A20. The data line drive circuit 101 and the scanning line drive circuit 102 are a peripheral circuit that controls driving of each portion constituting the plurality of sub-pixels P0. The control circuit 103 controls display of an image. Image data is supplied from a higher circuit (not illustrated) to the control circuit 103. The control circuit 103 supplies various signals based on the image data to the data line drive circuit 101 and the scanning line drive circuit 102. Although not illustrated, a flexible printed circuit (FPC) substrate and the like are coupled to the external terminal 104 for electrical coupling with the higher circuit. Further, a power supply circuit (not illustrated) is electrically coupled to the element substrate 1.

The transmissive substrate 7 is a cover that protects a light-emitting portion 2 and a colored layer 5, which will be described later, included in the element substrate 1. The transmissive substrate 7 is formed of, for example, a glass substrate or a quartz substrate.

Figure 2:
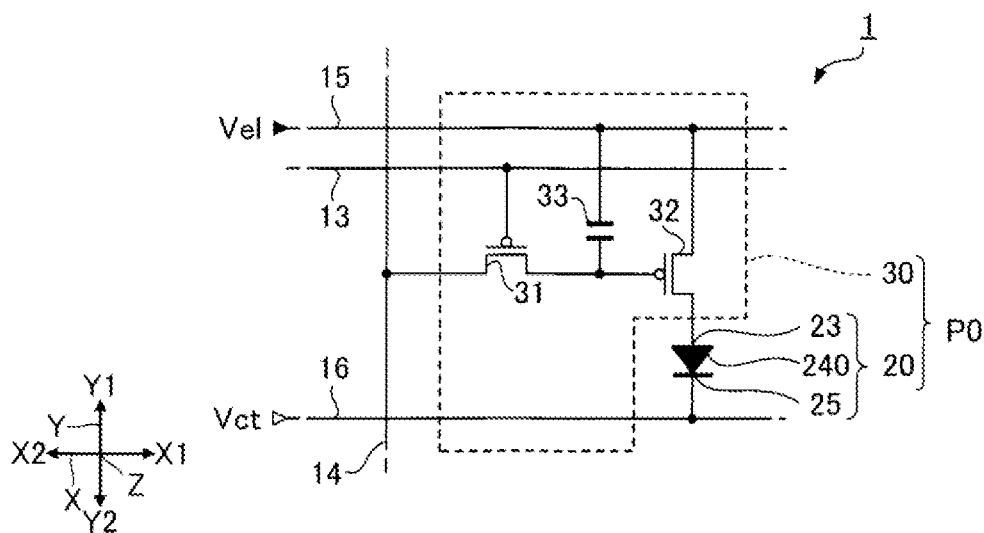
FIG. 2 is an equivalent circuit diagram of a sub-pixel illustrated in FIG. 1.

FIG. 2 is an equivalent circuit diagram of the sub-pixel P0 illustrated in FIG. 1. The element substrate 1 is provided with a plurality of scanning lines 13, a plurality of data lines 14, a plurality of power supplying lines 15, and a plurality of power supplying lines 16. In FIG. 2, one sub-pixel P0 and an element corresponding to the sub-pixel P0 are representatively illustrated.

The scanning line 13 extends in the X1 direction, and the data line 14 extends in the Y1 direction. Note that, although not illustrated, the plurality of scanning lines 13 and the plurality of data lines 14 are arrayed in a lattice shape. Further, the scanning line 13 is coupled to the scanning line drive circuit 102 illustrated in FIG. 1, and the data line 14 is coupled to the data line drive circuit 101 illustrated in FIG. 1.

As illustrated in FIG. 2, the sub-pixel P0 includes a light-emitting element 20 and a pixel circuit 30 that controls driving of the light-emitting element 20. The light-emitting element 20 is formed of an organic light-emitting diode (OLED). The light-emitting element 20 includes a pixel electrode 23, a common electrode 25, and a light-emitting layer 240.

The power supplying line 15 is electrically coupled to the pixel electrode 23 via the pixel circuit 30. On the other hand, the power supplying line 16 is electrically coupled to the common electrode 25. Here, a power supply potential Vel on a high potential side is supplied from the power supply circuit (not illustrated) to the power supplying line 15. A power supply potential Vct on a low potential side is supplied from the power supply circuit (not illustrated) to the power supplying line 16. The pixel electrode 23 functions as an anode, and the common electrode 25 functions as a cathode. In the light-emitting element 20, a positive hole supplied from the pixel electrode 23 and an electron supplied from the common electrode 25 are recombined in the light-emitting layer 24, and thus the light-emitting layer 24 emits light. Note that the pixel electrode 23 is provided for each of the sub-pixels P0, and the pixel electrode 23 is controlled independently from the other pixel electrode 23.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to the power supplying line 15, and the other is electrically coupled to the pixel electrode 23. Further, one of electrodes of the retention capacitor 33 is coupled to the gate of the driving transistor 32, and the other electrode is coupled to the power supplying line 15.

In the pixel circuit 30 described above, when the scanning line 13 is selected by activating the scanning signal by the scanning line drive circuit 102, the switching transistor 31 provided in the selected sub-pixel P0 is turned on. Then, the data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the light-emitting element 20. Then, the light-emitting element 20 emits light at a luminance corresponding to a magnitude of the current supplied from the driving transistor 32. Further, when the scanning line drive circuit 102 releases the selection of the scanning line 13 and the switching transistor 31 is turned off, the potential of the gate of the driving transistor 32 is held by the retention capacitor 33. Thus, the light-emitting element 20 can maintain light emission of the light-emitting element 20 even after the switching transistor 31 is turned off.

Note that the configuration of the pixel circuit 30 described above is not limited to the illustrated configuration. For example, the pixel circuit 30 may further include a transistor that controls conduction between the pixel electrode 23 and the driving transistor 32.

1A-2. Element Substrate 1

Figure 3:
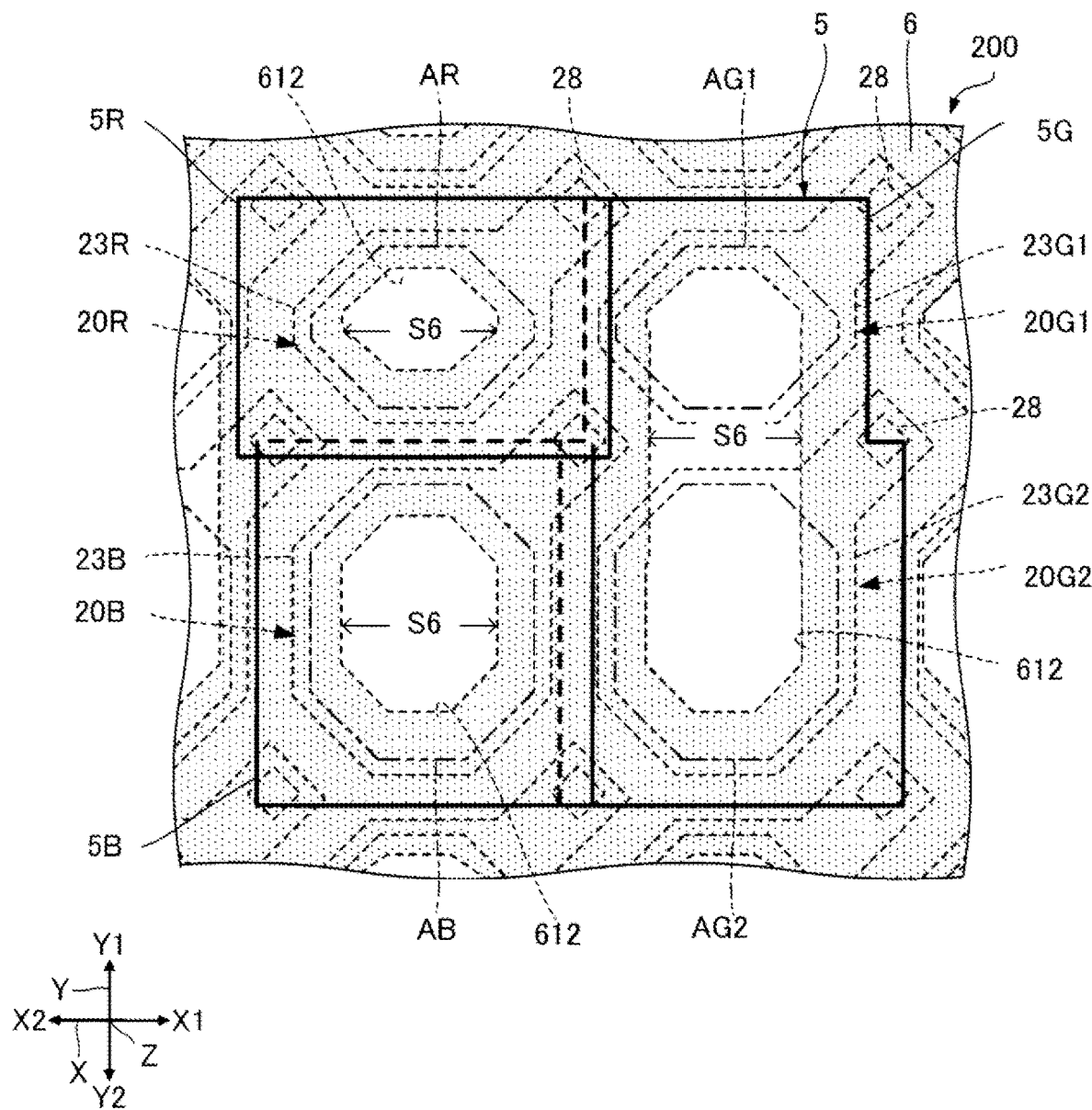
FIG. 3 is a plan view illustrating a part of an element substrate.

FIG. 3 is a plan view illustrating a part of the element substrate 1 illustrated in FIG. 1. In FIG. 3, an element of one pixel P is representatively illustrated. Hereinafter, an end of a sign of an element associated with the sub-pixel PR is denoted by "R", an end of a sign of an element associated with the sub-pixel PG is denoted by "G", and an end of a sign of an element associated with the sub-pixel PB is denoted by "B". Note that when each light-emitting color is not differentiated, the "B", "G", and "R" at the end of the signs are omitted.

As illustrated in FIG. 3, the element substrate 1 includes a set of light-emitting elements 20R, 20B, 20G1, and 20G2 for each of the pixel P. The light-emitting element 20R is a light-emitting element 20 provided in the sub-pixel PR. The light-emitting element 20B is a light-emitting element 20 provided in the sub-pixel PB. Each of the light-emitting elements 20G1 and 20G2 is the light-emitting element 20 provided in the sub-pixel PG.

In the present exemplary embodiment, the light-emitting element 20R corresponds to a first light-emitting element, the light-emitting element 20B corresponds to a second light-emitting element, and each of the light-emitting elements 20G1 and 20G2 corresponds to a third light-emitting element. Note that the light-emitting elements 20G1 and 20G2 share one pixel circuit 30 for each of the sub-pixels PG. Therefore, the light-emitting elements 20G1 and 20G2 may be taken as one light-emitting element 20G.

The light-emitting element 20R includes a light-emitting region AR that emits light in a wavelength region including the red wavelength region. The light-emitting element 20B includes a light-emitting region AB that emits light in a wavelength region including the blue wavelength region. The light-emitting element 20G1 includes a light-emitting region AG1 that emits light in a wavelength region including the green wavelength region. The light-emitting element 20G2 includes a light-emitting region AG2 that emits light in a wavelength region including the green wavelength region. In the present exemplary embodiment, the light-emitting region AR corresponds to a first light-emitting region, the light-emitting region AB corresponds to a second light-emitting region, and each of the light-emitting regions AG1 and AG2 corresponds to a third light-emitting region. Further, the light-emitting region A may be considered to correspond to the light-emitting element 20.

Further, in the example illustrated in FIG. 3, a shape of each of the light-emitting regions AR, AG1, AG2, and AB in plan view is an octagon. Each area of the light-emitting regions AR and AB is smaller than a sum of areas of the light-emitting regions AG1 and AG2. The "area" refers to an area in plan view. Note that shapes of the light-emitting regions AR, AG1, AG2, and AB may be different from each other or may be equal to each other.

Figure 4:
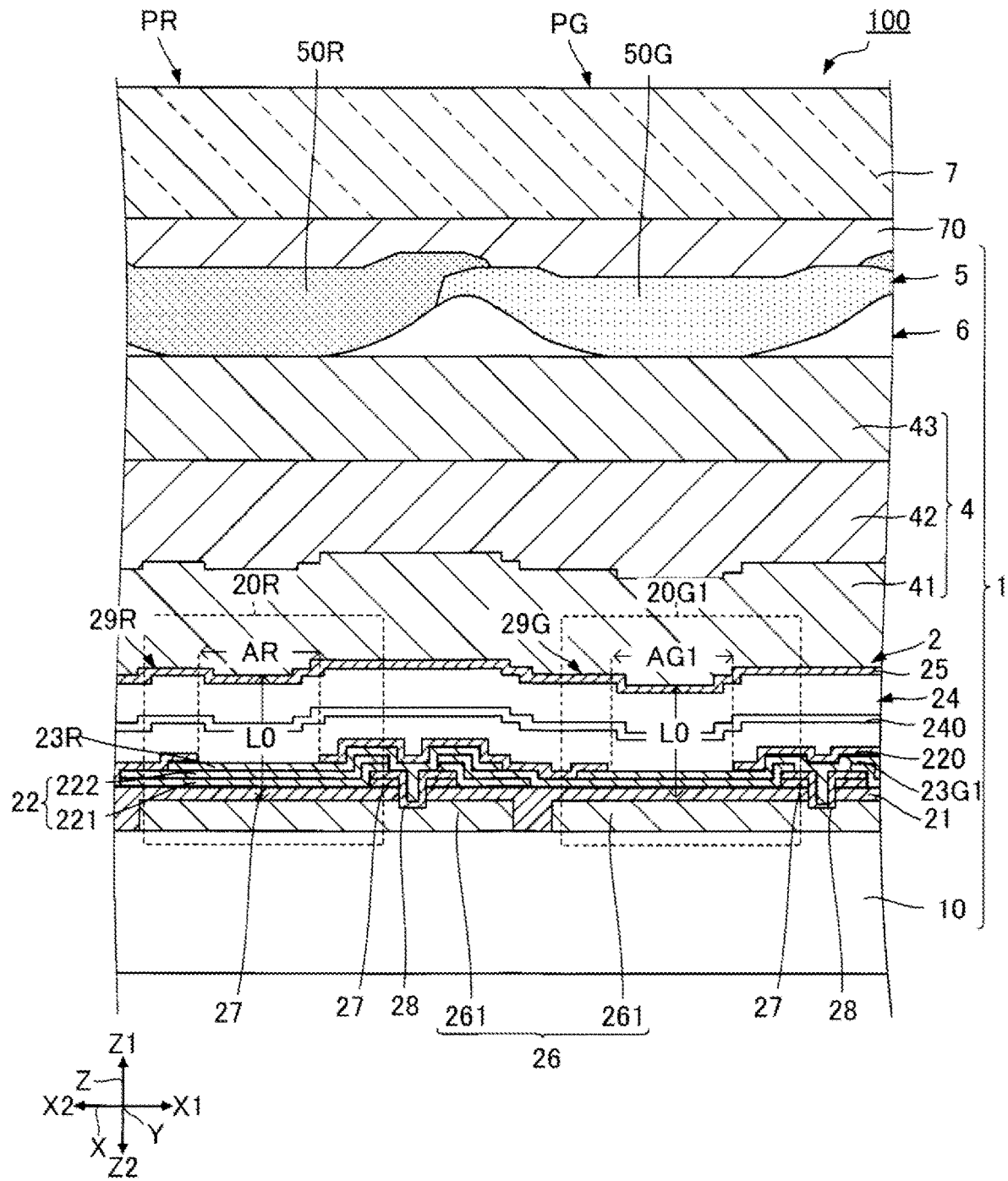
FIG. 4 is a cross-sectional view of the electro-optical device illustrated in FIG. 1.
Figure 5:
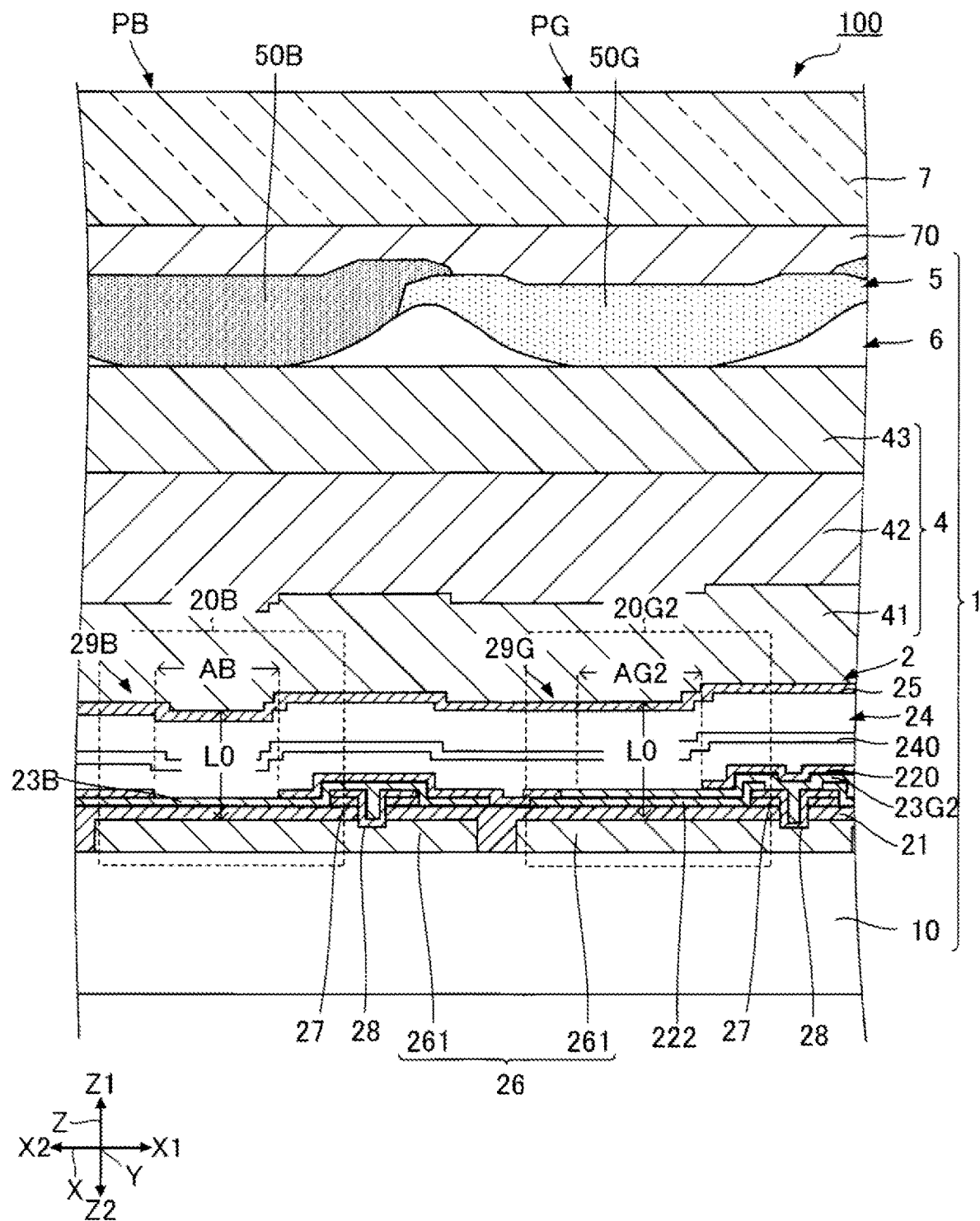
FIG. 5 is a cross-sectional view of the electro-optical device illustrated in FIG. 1.

Each of FIGS. 4 and 5 is a cross-sectional view of the electro-optical device 100 in FIG. 1. FIG. 4 corresponds to a cross section of the sub-pixels PR and PG, and FIG. 5 corresponds to a cross section of the sub-pixels PB and PG. In the following description, it is assumed that the Z1 direction is upward and the Z2 direction is downward.

As illustrated in FIG. 4 and FIG. 5, the element substrate 1 includes a substrate 10, the light-emitting element 20, a sealing layer 4, and the colored layer 5. The light-emitting element 20 and the sealing layer 4 are disposed between the substrate 10 and the colored layer 5. Further, the light-emitting portion 2 includes the plurality of light-emitting elements 20 described above. Note that the transmissive substrate 7 described above is bonded to the element substrate 1 by an adhesive layer 70.

Although not illustrated in detail, the substrate 10 is a wiring substrate in which the pixel circuit 30 described above is formed on a silicon substrate, for example. Note that, instead of the silicon substrate, for example, a glass substrate, a resin substrate, or a ceramic substrate may be used. Further, although not illustrated in detail, each transistor, which is described above, included in the pixel circuit 30 may be a MOS transistor, a thin film transistor, or a field effect transistor. When the transistor included in the pixel circuit 30 is the MOS transistor including an active layer, the active layer may be formed of the silicon substrate. Further, a material for each element and various types of wiring included in the pixel circuit 30 includes, for example, a conductive material such as polysilicon, metal, metal silicide, and a metallic compound.

The light-emitting portion 2 is disposed on the substrate 10. The light-emitting portion 2 includes a reflection layer 26, an insulating layer 21, a light path adjustment layer 22, an element separation layer 220, the plurality of pixel electrodes 23, an organic layer 24, and the common electrode 25. The light-emitting portion 2 forms the plurality of light-emitting elements 20 described above by these elements. Note that the insulating layer 21, the light path adjustment layer 22, the element separation layer 220, the organic layer 24, and the common electrode 25 are common in the plurality of light-emitting elements 20. Further, the organic layer 24 includes the light-emitting layer 240 described above.

The reflection layer 26 is disposed between the substrate 10 and the light-emitting layer 240. The reflection layer 26 includes a plurality of reflection sections 261 having light reflectivity. The "light reflectivity" refers to reflectivity with respect to the visible light, and preferably means that a reflectance of the visible light is greater than or equal to 50%. Each of the reflection sections 261 reflects light generated in the light-emitting layer 240. Note that, although not illustrated, the plurality of reflection sections 261 are disposed corresponding to the plurality of sub-pixels P0 in plan view. Examples of a material of the reflection layer 26 include, for example, metal such as aluminum (Al) and silver (Ag), or alloy of these metals. Note that the reflection layer 26 may function as wiring being electrically coupled to the pixel circuit 30. Further, although not illustrated, an enhanced reflection layer having optical transparency and insulating property for enhancing the light reflectivity of the reflection layer 26 may be disposed between the reflection layer 26 and the insulating layer 21. The enhanced reflection layer is, for example, a silicon oxide film.

The insulating layer 21 is disposed on the reflection layer 26, and is filled between the plurality of reflection sections 261 included in the reflection layer 26. The insulating layer 21 is formed of, for example, a silicon nitride (SiN) film. Note that, although not illustrated in detail, the insulating layer 21 is, for example, a stack of a plurality of layers.

A plurality of contact electrodes 28 are disposed on the insulating layer 21. The contact electrode 28 is provided for each light-emitting element 20. The contact electrode 28 electrically couples the pixel circuit 30 and the pixel electrode 23. Note that an insulating portion 27 formed of an insulating material such as silicon oxide is provided between the contact electrode 28 and the insulating layer 21. Further, a material of the contact electrode 28 is, for example, a conductive material such as tungsten (W), titanium (Ti), and titanium nitride (TiN).

The light path adjustment layer 22 is disposed on the insulating layer 21. The light path adjustment layer 22 is a layer that adjusts an optical distance L0 being an optical distance between the reflection section 261 and the common electrode 25 described later. The light path adjustment layer 22 is formed of a plurality of films having the insulating property. Specifically, the light path adjustment layer 22 includes a first insulating film 221 and a second insulating film 222. The first insulating film 221 is disposed in the sub-pixel PR and is not disposed in the sub-pixels PB and PG. The second insulating film 222 is disposed on at least the first insulating film 221. The second insulating film 222 is disposed in the sub-pixels PR and PG and is not disposed in the sub-pixel PB. Examples of a material of the light path adjustment layer 22 include, for example, a silicon-based inorganic material such as silicon oxide and silicon nitride.

The plurality of pixel electrodes 23 are disposed on the light path adjustment layer 22. The pixel electrode 23 is provided for each light-emitting element 20. Although not illustrated, each of the pixel electrodes 23 overlaps a corresponding reflection section 261 in plan view. Each of the pixel electrodes 23 has optical transparency and conductivity. Examples of a material of the pixel electrode 23 include a transparent conductive material such as Indium Tin Oxide (ITO) and Indium Zinc Oxide (IZO). Note that a pixel electrode 23R is the pixel electrode 23 provided in the sub-pixel PR. Pixel electrodes 23G1 and 23G2 are the pixel electrode 23 provided in the sub-pixel PG. The pixel electrodes 23G1 and 23G2 may be separately formed or may be integrally formed. The pixel electrode 23B is a pixel electrode 23 provided in the sub-pixel PB.

Further, the element separation layer 220 including a plurality of openings is disposed on the light path adjustment layer 22. The element separation layer 220 covers an outer edge of each of the plurality of pixel electrodes 23. The element separation layer 220 electrically insulates the plurality of pixel electrodes 23 from each other. A plurality of light-emitting regions A are defined by the plurality of openings included in the element separation layer 220. Further, the light-emitting region A can be defined as a region in which the organic layer 24 and the pixel electrode 23 are in contact. Specifically, the light-emitting region AR included in the light-emitting element 20R, the light-emitting region AG1 included in the light-emitting element 20G1, the light-emitting region AG2 included in the light-emitting element 20G2, and the light-emitting region AB included in the light-emitting element 20B are defined. Examples of a material of the element separation layer 220 include, for example, a silicon-based inorganic material such as silicon oxide and silicon nitride.

The organic layer 24 is disposed on the plurality of pixel electrodes 23. The organic layer 24 includes the light-emitting layer 240 including an organic light-emitting material. The organic light-emitting material is a light-emitting organic compound. Further, the organic layer 24 includes, for example, a positive hole injecting layer, a positive hole transport layer, an electron transport layer, an electron injecting layer, and the like other than the light-emitting layer 240. The organic layer 24 includes the light-emitting layer 240 in which each light-emitting color of blue, green, and red is obtained, and white light emission is achieved. Note that a configuration of the organic layer 24 is not particularly limited to the configuration described above, and a known configuration can be applied.

The common electrode 25 is disposed on the organic layer 24. The common electrode 25 is disposed between the light-emitting layer 240 and the colored layer 5. The common electrode 25 is a semi-transparent reflection layer having light reflectivity and optical transparency. Further, the common electrode 25 has conductivity. The common electrode 25 is formed of, for example, an alloy including Ag such as MgAg.

In the light-emitting portion 2 described above, the light-emitting element 20R includes the reflection section 261, the insulating layer 21, the first insulating film 221, the second insulating film 222, the element separation layer 220, the pixel electrode 23R, the organic layer 24, and the common electrode 25. The light-emitting element 20G1 includes the reflection section 261, the insulating layer 21, the second insulating film 222, the element separation layer 220, the pixel electrode 23G1, the organic layer 24, and the common electrode 25. The light-emitting element 20G2 includes the reflection section 261, the insulating layer 21, the second insulating film 222, the element separation layer 220, the pixel electrode 23G2, the organic layer 24, and the common electrode 25. The light-emitting element 20B includes the reflection section 261, the insulating layer 21, the element separation layer 220, the pixel electrode 23B, the organic layer 24, and the common electrode 25.

Here, the optical distance L0 between the reflection layer 26 and the common electrode 25 is different for each of the sub-pixels P0. Specifically, the optical distance L0 in the sub-pixel PR is set so as to correspond to the red wavelength region. The optical distance L0 in the sub-pixel PG is set so as to correspond to the green wavelength region. The optical distance L0 in the sub-pixel PB is set so as to correspond to the blue wavelength region.

Thus, each of the light-emitting elements 20 includes a light resonance structure 29 that resonates light in a predetermined wavelength region between the reflection layer 26 and the common electrode 25. The light-emitting elements 20R, 20G, and 20B have the light resonance structure 29 different from each other. The light resonance structure 29 causes light emitted from the light-emitting layer 240 included in the organic layer 24 to be multiply-reflected between the reflection layer 26 and the common electrode 25, and selectively enhances light in a predetermined wavelength region. The light-emitting element 20R includes a light resonance structure 29R that enhances light in the red wavelength region between the reflection layer 26 and the common electrode 25. The light-emitting element 20G includes a light resonance structure 29G that enhances light of the green wavelength between the reflection layer 26 and the common electrode 25. The light-emitting element 20B includes a light resonance structure 29B that enhances light of the blue wavelength between the reflection layer 26 and the common electrode 25.

A resonance wavelength in the light resonance structure 29 is determined by the optical distance L0. When the resonance wavelength is represented by $\lambda 0$, the following relationship [1] holds true. Note that $\Phi$ (radian) in the relationship [1] represents a sum of a phase shift that occurs during transmission and reflection between the reflection layer 26 and the common electrode 25.

$$\{(2\times L0)/\lambda 0+\Phi\}/(2\pi)=m0 \ (m0 \text{ is an integer}) \quad [1]$$

The optical distance L0 is set such that a peak wavelength of light in a wavelength region to be extracted is a wavelength $\lambda 0$. The light in a predetermined wavelength region to be extracted is enhanced by the setting, and the light can be increased in intensity and a spectrum of the light can be narrowed.

In the present exemplary embodiment, as described above, the optical distance L0 is adjusted by setting a different thickness of the light path adjustment layer 22 for each of the sub-pixels PB, PG, and PR. Note that a method for adjusting the optical distance L0 is not limited to a method for adjusting the optical distance L0 by a thickness of the light path adjustment layer 22. For example, the optical distance L0 may be adjusted by setting a different thickness of the pixel electrode 23 for each of the sub-pixels PB, PG, and PR.

The sealing layer 4 is disposed on the plurality of light-emitting elements 20. The sealing layer 4 protects the plurality of light-emitting elements 20. Specifically, the sealing layer 4 is a sealing layer that seals the plurality of light-emitting elements 20 in order to protect the plurality of light-emitting elements 20 from outside. The sealing layer 4 has gas barrier property, and protects each of the light-emitting elements 20 from external moisture, oxygen, or the like, for example. By providing the sealing layer 4, degradation of the light-emitting element 20 can be suppressed as compared to a case in which the sealing layer 4 is not provided. Thus, quality reliability of the electro-optical device 100 can be increased. Further, the sealing layer 4 has optical transparency.

The sealing layer 4 includes a first layer 41, a second layer 42, and a third layer 43. The first layer 41, the second layer 42, and the third layer 43 are stacked in the order toward a direction away from the substrate 10. The first layer 41, the second layer 42, and the third layer 43 have insulating property. Each material of the first layer 41 and the third layer 43 is, for example, an inorganic compound such as silicon oxynitride (SiON). The second layer 42 is a flattened layer for providing a flat surface to the third layer 43. A material of the second layer 42 is, for example, a resin such as an epoxy resin or an inorganic compound. Note that the sealing layer 4 includes three layers, but may include one, two, or four or more layers. Further, the third layer 43 in contact with the colored layer 5 includes an inorganic compound, but a layer in contact with the colored layer 5 may include a resin.

The colored layer 5 is a color filter that selectively transmits light in a predetermined wavelength region. The predetermined wavelength region includes the peak wavelength $\lambda 0$ determined by the optical distance L0 described above. By providing the colored layer 5, color purity of light emitted from each of the sub-pixels P0 can be increased as compared to a case in which the colored layer 5 is not provided. The colored layer 5 is formed of a resin material such as an acrylic based photosensitive resin material including a color material, for example. The color material is a pigment or a dye.

The colored layer 5 includes a colored portion 50R provided corresponding to the sub-pixel PR, a colored portion 50B provided corresponding to the sub-pixel PB, and a colored portion 50G provided corresponding to the sub-pixel PG. The colored portion 50 is provided for each of the sub-pixels P0. The colored portion 50R is a color filter that selectively transmits light in the red wavelength region of light from the light-emitting element 20R. The colored portion 50B is a color filter that selectively transmits light in the blue wavelength region of light from the light-emitting element 20B. The colored portion 50G is a color filter that selectively transmits light in the green wavelength region of light from the light-emitting elements 20G1 and 20G2.

The wall portion 6 is disposed opposite to the substrate 10 with respect to the light-emitting layer 240. Specifically, the wall portion 6 is disposed between the light-emitting layer 240 and the colored layer 5. The wall portion 6 is disposed between the sub-pixels P0. The wall portion 6 is provided in order to increase adhesion of the colored layer 5 with respect to the element substrate 1. The wall portion 6 has optical transparency. The wall portion 6 is formed of, for example, a transparent resin material. Examples of the resin material include, for example, an epoxy resin, an acrylic resin, and the like.

The transmissive substrate 7 is bonded onto the element substrate 1 described above via the adhesive layer 70. The adhesive layer 70 is a transparent adhesive using a resin material such as an epoxy resin and an acrylic resin, for example.

1A-3. Wall Portion 6 and Colored Layer 5

The wall portion 6 is mainly disposed between the sub-pixels P0 adjacent to each other. In the present exemplary embodiment, the wall portion 6 is disposed so as to surround the sub-pixel P0 in plan view. Thus, the wall portion 6 functions as a wall-like member that partitions the sub-pixel P0. Specifically, as illustrated in FIG. 3, the wall portion 6 is mainly disposed between the light-emitting region AR and the light-emitting region AB, between the light-emitting region AR and the light-emitting region AG1, and between the light-emitting region AB and the light-emitting region AG2. Note that, in FIG. 3, the wall portion 6 is provided with a dot pattern for convenience.

As illustrated in FIG. 3, the wall portion 6 includes an opening S6 corresponding to each of the sub-pixels P0 in plan view. The opening S6 overlaps the light-emitting region A in plan view. Note that the opening S6 provided in the sub-pixel PG overlaps the two light-emitting regions AG1 and AG2 in plan view.

In the illustrated example, a part of the wall portion 6 is located within the light-emitting region A. Thus, the wall portion 6 includes a portion located within the light-emitting region A in addition to a portion located in a region between the light-emitting regions A adjacent to each other in plan view.

Further, at least a top portion 611 of the wall portion 6 is disposed so as to surround the light-emitting region AR in plan view. The wall portion 6 is disposed along an edge of the light-emitting region AR in plan view, and covers the edge. Similarly, the wall portion 6 is disposed so as to surround the light-emitting region AB in plan view. The wall portion 6 is disposed along an edge of the light-emitting region AB in plan view, and covers the edge. Further, the wall portion 6 is disposed so as to surround the light-emitting regions AG1 and AG2 in plan view. The wall portion 6 includes a portion that overlaps the edges of the light-emitting regions AG1 and AG2 in plan view.

As illustrated in FIG. 3, each colored portion 50 includes a portion that overlaps the wall portion 6 in plan view and a portion that does not overlap the wall portion 6 in plan view. The portion that does not overlap the wall portion 6 is a portion located within the opening S6 of the wall portion 6 in plan view.

Further, the colored portions 50R, 50B, and 50G include a portion that overlaps each other in plan view. In other words, there is a portion in which the colored portions 50 of three colors overlap each other in plan view. Further, the colored portions 50R and 50B include a portion that overlaps each other in plan view. Similarly, the colored portions 50B and 50G include a portion that overlaps each other in plan view. Further, the colored portions 50G and 50R include a portion that overlaps each other in plan view. Note that the plurality of colored portions 50 may not overlap each other.

Figure 6:
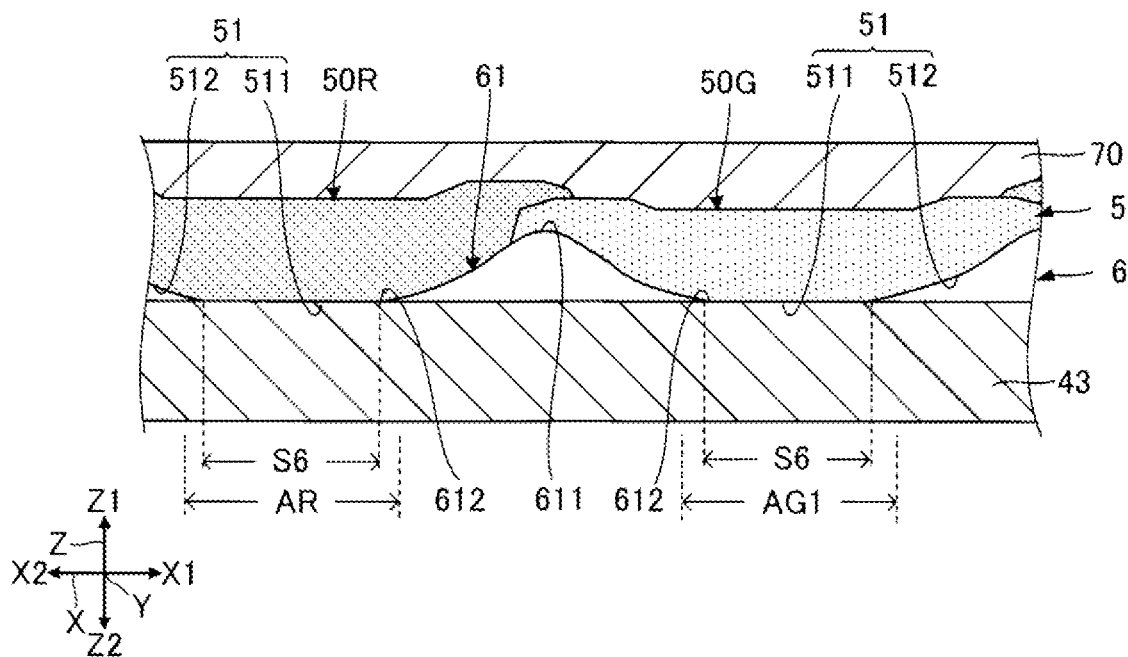
FIG. 6 is a cross-sectional view illustrating a wall portion and a colored layer.
Figure 7:
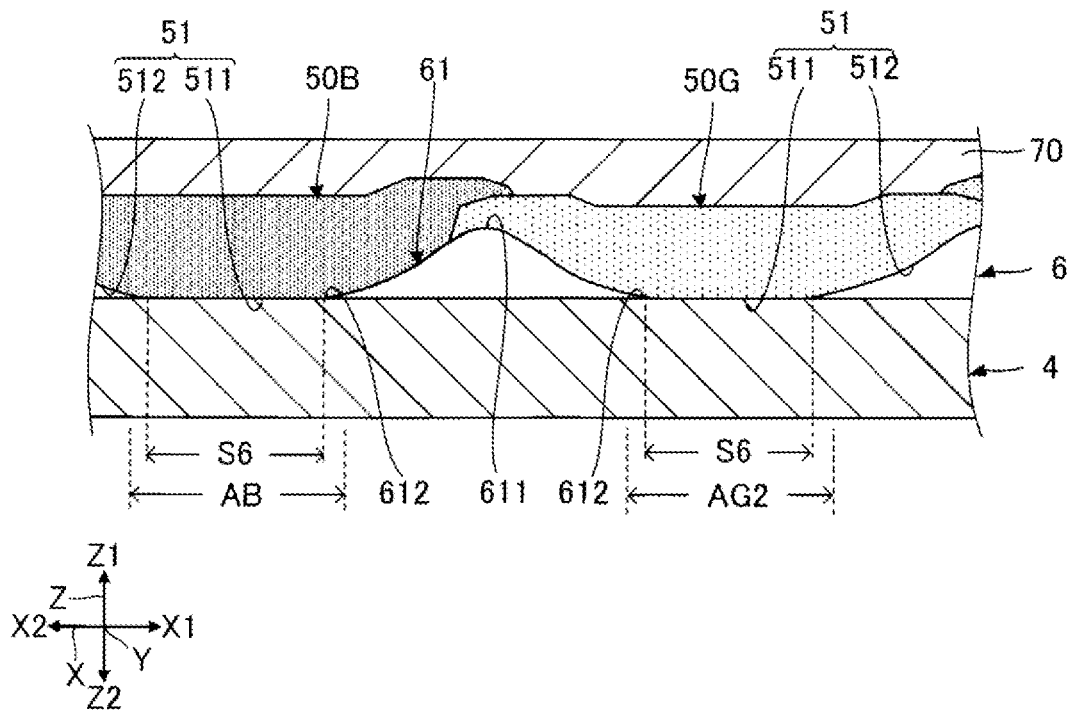
FIG. 7 is a cross-sectional view illustrating the wall portion and the colored layer.

Each of FIGS. 6 and 7 is a cross-sectional view illustrating the wall portion 6 and the colored layer 5. As illustrated in FIGS. 6 and 7, the wall portion 6 is located on the sealing layer 4 and is in contact with the sealing layer 4. Further, the wall portion 6 is in contact with the colored layer 5.

The wall portion 6 protrudes from a region between the sub-pixels P0 adjacent to each other into the sub-pixel P0 while having a thickness decreasing. Specifically, as illustrated in FIG. 6, the wall portion 6 protrudes from a region between the light-emitting region AR and the light-emitting region AG1 toward each of the light-emitting regions AR and AG1 while having a thickness decreasing. Further, as illustrated in FIG. 7, the wall portion 6 protrudes from a region between the light-emitting region AB and the light-emitting region AG2 toward each of the light-emitting regions AB and AG2 while having a thickness decreasing. Further, although not illustrated, the wall portion 6 protrudes from a region between the light-emitting region AR and the light-emitting region AB toward each of the light-emitting regions AR and AB while having a thickness decreasing. Note that the "thickness" refers to a length in the Z1 direction.

A lower surface of the wall portion 6 in contact with the sealing layer 4 is a flat surface. On the other hand, an upper surface 61 in contact with the colored layer 5 of the wall portion 6 is a curved surface. The upper surface 61 includes the top portion 611 and a plurality of end portions 612. The top portion 611 is a portion in contact with the colored layer 5 in the thickest portion of the wall portion 6. Each of the end portions 612 is an edge of the wall portion 6, and is a portion in contact with the colored layer 5 in the thinnest portion of the wall portion 6. A thickness of the wall portion 6 in each of the end portions 612 is smaller than a thickness of the wall portion 6 in the top portion 611. Thus, a thickness of the wall portion 6 decreases from the top portion 611 toward each of the end portions 612. Further, the upper surface 61 is recessed in a curved shape toward the substrate 10 between the top portion 611 and the end portion 612.

Further, the top portion 611 is located in a region between the sub-pixels P0 adjacent to each other. Specifically, the top portion 611 does not overlap the light-emitting region A in plan view. The top portion 611 is located between the light-emitting regions AR and AB, between the light-emitting regions AR and AG1, and between the light-emitting regions AB and AG2. Further, as illustrated in FIG. 3, the end portion 612 is located within each of the light-emitting regions A in plan view. In the present exemplary embodiment, the end portion 612 located in the light-emitting region AR in plan view corresponds to a first end portion, and the end portion 612 located in the light-emitting region AB in plan view corresponds to a second end portion. Further, the end portion 612 located in the light-emitting regions AG1 and AG2 in plan view is a third end portion. Further, the end portion 612 forms the opening S6. Further, the end portion 612 may be disposed so as not to overlap the light-emitting region A in plan view. When the end portion 612 does not overlap the light-emitting region A in plan view, the end portion 612 is located between the light-emitting regions AR and AB, between the light-emitting regions AR and AG1, and between the light-emitting regions AB and AG2.

In the example illustrated in FIGS. 6 and 7, the colored portions 50G, 50B, and 50R are formed on the wall portion 6 in the order. Thus, as illustrated in FIG. 7, a part of the colored portion 50G is located between the wall portion 6 and the colored portion 50B. Further, as illustrated in FIG. 6, a part of the colored portion 50G is located between the wall portion 6 and the colored portion 50R. Note that, although not illustrated, a part of the colored portion 50B is located between the wall portion 6 and the colored portion 50R.

The colored layer 5 fills the plurality of openings S6, and covers the sealing layer 4 and the wall portion 6. Further, the colored layer 5 includes a plurality of contact surfaces 51 in contact with the sealing layer 4 and the wall portion 6. The contact surface 51 is provided for each of the colored portions 50. The contact surface 51 includes a first surface 511 in contact with the sealing layer 4, and a second surface 512 in contact with the wall portion 6. The first surface 511 is a flat surface. The second surface 512 is inclined with respect to the first surface 511. Further, the second surface 512 is a curved surface that protrudes toward the substrate 10. Thus, the contact surface 51 includes the curved surface that protrudes toward the substrate 10.

The second surface 512 is inclined from the contact portion with the top portion 611 toward the contact portion of each end portion 612. Thus, a thickness of the colored layer 5 gradually increases from the contact portion with the top portion 611 toward the contact portion of each end portion 612. Therefore, a thickness of the colored layer 5 in the contact portion with the end portion 612 is greater than a thickness of the colored layer 5 in the contact portion with the top portion 611.

Further, a first refractive index being a refractive index of the wall portion 6 and a second refractive index being a refractive index of the colored layer 5 are different from each other. Then, as described above, the colored layer 5 includes the second surface 512 being a curved surface that is in contact with the wall portion 6 and protrudes toward the wall portion 6. In other words, the second surface 512 may be considered to be a curved surface that is in contact with the wall portion 6 and protrudes toward the substrate 10. Thus, the second surface 512 functions as a lens surface. Therefore, a lens function can be obtained by the wall portion 6 and the colored layer 5. Further, since the lens surface on the colored layer 5 is formed, an indentation may not be formed in the sealing layer 4. In other words, sealing performance of the sealing layer 4 can be prevented from decreasing by forming an indentation in the sealing layer 4. Thus, the electro-optical device 100 can easily obtain the lens function with a large curvature. Further, both of the sealing performance of the sealing layer 4 and the lens function of the colored layer 5 can be achieved. Further, in the electro-optical device 100, the second surface 512 of the colored layer 5 is formed by the wall portion 6, and thus the second surface 512 having a desired curvature can be easily formed by changing a thickness of the wall portion 6, for example.

Further, in the present exemplary embodiment, the first refractive index is smaller than the second refractive index. Thus, light from the light-emitting region A can be condensed. Thus, the light extraction efficiency can be improved.

Figure 8:
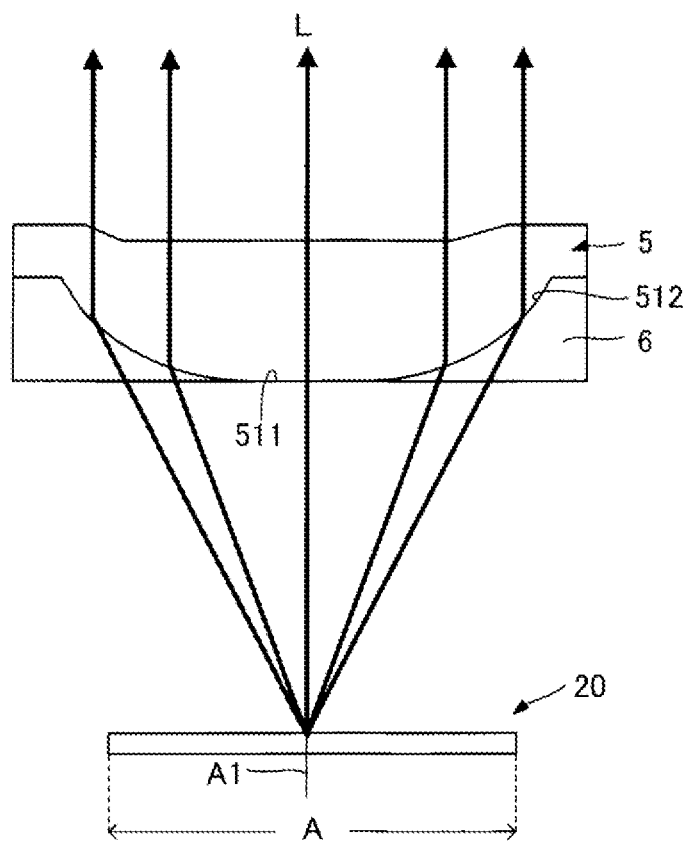
FIG. 8 is a diagram for illustrating a lens function of the colored layer according to the first exemplary embodiment.

FIG. 8 is a diagram for illustrating the lens function of the colored layer 5 according to the first exemplary embodiment. Note that, in FIG. 8, a central axis A1 parallel to the Z-axis is illustrated through the center of the light-emitting region A in plan view.

As illustrated in FIG. 8, light L along the central axis A1 of light L emitted from the light-emitting region A is incident on the first surface 511 and is emitted from the colored layer 5 along the central axis A1. Further, the light L inclined with respect to the central axis A1 of the light L emitted from the light-emitting region A is incident on the second surface 512 and is refracted by the second surface 512. Then, the refracted light L travels along the central axis A1 or travels in a direction close to a direction along the central axis A1. Thus, the light L emitted from the light-emitting region A is condensed by the lens function of the colored layer 5. Thus, the light extraction efficiency can be improved.

Figure 9:
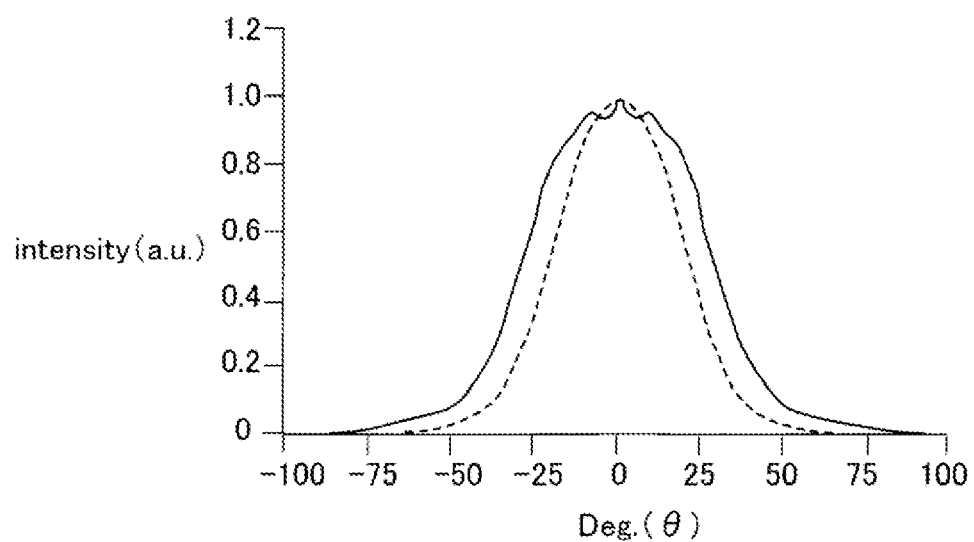
FIG. 9 is a simulation result of intensity of light according to the first exemplary embodiment.

FIG. 9 is a simulation result of intensity of light according to the first exemplary embodiment. A solid line in FIG. 9 is a result of a case in which the colored layer 5 includes the second surface 512 being the lens surface. A dashed line in FIG. 9 is a result of a case in which the colored layer 5 does not include the lens surface. As illustrated in FIG. 9, it can be seen that the colored layer 5 includes the second surface 512 being the lens surface, and thus the intensity of light is increased by a condensing effect as compared to a case in which the colored layer 5 does not include the lens surface. As can be seen from FIG. 9, the colored layer 5 includes the second surface 512, and thus the light extraction efficiency can be improved.

Further, as described above, the wall portion 6 includes the plurality of end portions 612. As illustrated in FIG. 3, each of the end portions 612 is disposed within the light-emitting region A in plan view. Thus, an area of the second surface 512 can be increased, and thus the amount of light incident on the second surface 512 can be increased. In other words, the light extraction efficiency can be enhanced as compared to a case in which the end portion 612 is located outside the light-emitting region A in plan view Thus, more intense light can be emitted at a wider angle. Note that the end portion 612 may overlap the edge of the light-emitting region A in plan view, or may be located outside the light-emitting region A.

Further, as described above, the wall portion 6 includes the opening S6 corresponding to the sub-pixel P0. Then, the wall portion 6 surrounds the sub-pixel P0. Further, the wall portion 6 surrounds the light-emitting region AR. Thus, the light extraction efficiency can be improved as compared to a case in which the wall portion 6 does not surround the light-emitting region AR. Similarly, since the wall portion 6 surrounds the light-emitting region AB, the light extraction efficiency can be enhanced as compared to a case in which the wall portion 6 does not surround the light-emitting region AB. Further, since the wall portion 6 surrounds the light-emitting regions AG1 and AG2, the light extraction efficiency can be enhanced as compared to a case in which the wall portion 6 does not surround the light-emitting regions AG1 and AG2.

Note that the wall portion 6 may not surround the light-emitting region A in plan view. In other words, the wall portion 6 may be provided in a part of a region between the sub-pixels P0 adjacent to each other in plan view.

As illustrated in FIG. 6 and FIG. 7, a maximum thickness of the wall portion 6 is thinner than a maximum thickness of the colored layer 5. However, a maximum thickness of the wall portion 6 is preferably greater than or equal to ½ of a maximum thickness of the colored layer 5. In particular, a maximum thickness of the wall portion 6 is preferably greater than or equal to ½ of a maximum thickness of each colored portion 50. In this way, an area of the second surface 512 can be increased as compared to a case in which a maximum thickness of the wall portion 6 is less than ½ of a maximum thickness of the colored layer 5. Further, a curvature of the second surface 512 can be increased. Thus, the lens performance by the second surface 512 can be increased.

Further, the wall portion 6 includes the top portion 611 covered by the colored layer 5. Thus, leakage light transmitted through the wall portion 6 can be suppressed compared to a case in which the top portion 611 is not covered by the colored layer 5.

Figure 10:
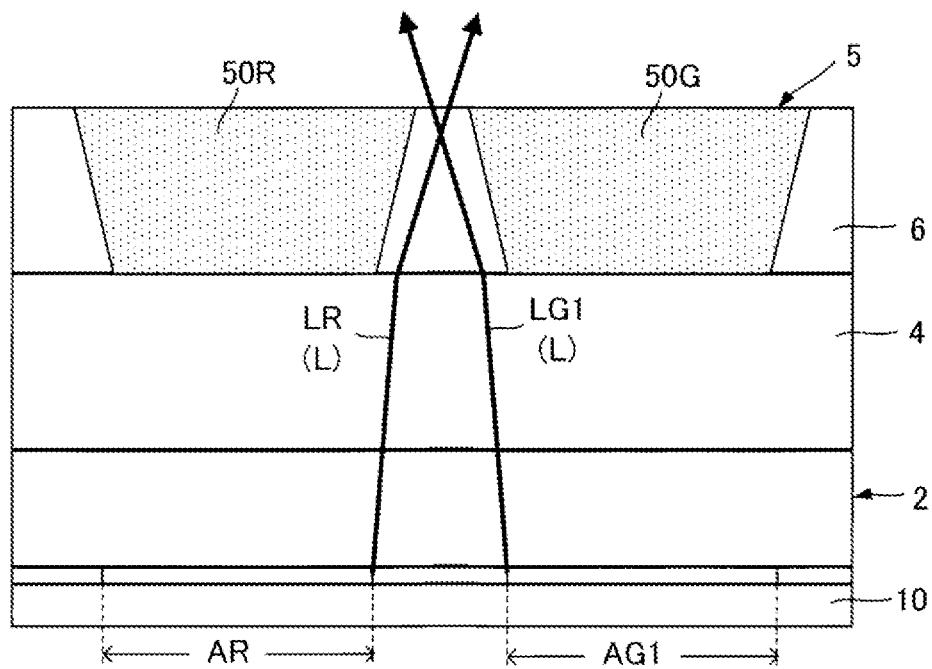
FIG. 10 is a diagram for illustrating leakage light when the wall portion is not covered by the colored layer.
Figure 11:
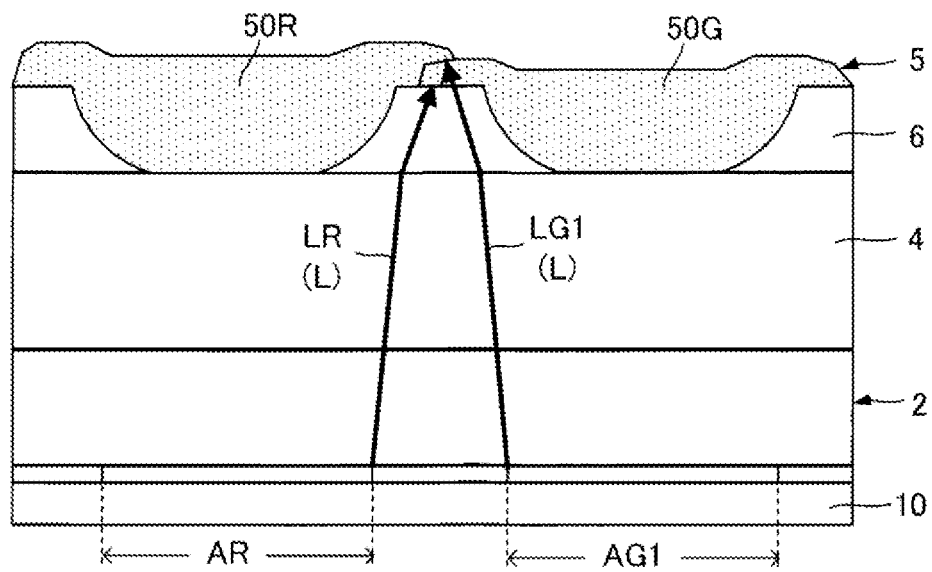
FIG. 11 is a diagram for illustrating leakage light when the wall portion is covered by the colored layer.

FIG. 10 is a diagram for illustrating leakage light when the wall portion 6 is not covered by the colored layer 5. FIG. 11 is a diagram for illustrating leakage light when the wall portion 6 is covered by the colored layer 5. As illustrated in FIG. 10, when the wall portion 6 is not covered by the colored layer 5, light emitted from the light-emitting region A is transmitted through the wall portion 6, and becomes the leakage light. As a result, there is a risk that color mixing due to the leakage of light from the adjacent sub-pixel P0 may occur.

In contrast, as illustrated in FIG. 11, the colored layer 5 is covered by the wall portion 6, and thus light transmitted through the wall portion 6 is blocked by the colored portion 50. For example, light LR transmitted through the wall portion 6 of light emitted from the light-emitting region AR is blocked by the colored portion 50G. Further, for example, light LG1 transmitted through the wall portion 6 of light emitted from the light-emitting region AG1 is transmitted through the colored portion 50G, but is blocked by the colored portion 50R. For this reason, the leakage light is suppressed. Thus, the occurrence of the color mixing due to the leakage of light from the adjacent sub-pixel P0 can be improved. Further, since the top portion 611 is covered by the colored portion 50R and the colored portion 50G, the leakage light passing through the wall portion 6 can be suppressed.

Note that a maximum thickness of the wall portion 6 may be greater than or equal to a maximum thickness of the colored layer 5. Thus, a position of the upper surface 61 of the wall portion 6 in the Z1 direction may coincide with a position of the upper surface of the colored layer 5 in the Z1 direction. Further, the upper surface 61 of the wall portion 6 may be exposed from the upper surface of the colored layer 5 in the Z1 direction. In this case, as compared to a case in which the upper surface 61 is not exposed from the colored layer 5, the lens performance by the colored layer 5 can be further enhanced.

Further, as described above, the light-emitting portion 2 includes the light-emitting layer 240, the reflection layer 26, the common electrode 25 being the "semi-transparent reflection layer", and the light resonance structure 29. The light resonance structure 29 resonates light emitted from the light-emitting layer 240 between the reflection layer 26 and the common electrode 25. When the light-emitting portion 2 does not have the light resonance structure 29, the light emitted from the light-emitting region A is close to Lambertian light distribution. In contrast, when the light-emitting portion 2 has the light resonance structure 29, directivity of the light emitted from the light-emitting region A increases as compared to a case in which the light-emitting portion 2 does not have the light resonance structure 29. Thus, luminous intensity of light emitted in the Z1 direction can be increased. Thus, proportion that light having a small incident angle is incident on the lens surface of the colored layer 5 can be reduced. Thus, proportion of a loss of light can be reduced.

The wall portion 6 is formed by the following method, for example. First, a resin layer is formed by applying a photosensitive resin such as an acrylic resin to the sealing layer 4 by a spin coating method, and drying the photosensitive resin. Subsequently, the resin layer is exposed by using ultraviolet (UV) light, and developed with an alkaline developer and the like. In this way, the wall portion 6 is formed. Further, in forming the wall portion 6, the UV light is defocused upon exposure. In this way, the wall portion 6 including a curved surface that is recessed toward the substrate 10 is formed. Further, also by performing so-called half development, the wall portion 6 including a curved surface that is recessed toward the substrate 10 is formed. Specifically, the half development is a developing method for performing development processing for a plurality of times, and stopping development before a resin layer completely disappears.

The colored layer 5 is formed by the following method, for example. First, a resin layer is formed by applying a photosensitive resin containing a green color material to the sealing layer 4 and the wall portion 6 by a spin coating method, and drying the photosensitive resin. Subsequently, the resin layer is exposed by using UV light and developed with an alkaline developer and the like. In this way, the colored portion 50G is formed. Next, after the colored portion 50B is formed by a similar method as the method for forming the colored portion 50B, the colored portion 50R is formed.

According to the electro-optical device 100 described above, the second surface 512 of the colored layer 5 with the wall portion 6 functions as a lens surface. Thus, a lens surface having a desired curvature can be easily created. Further, a lens function of the colored layer 5 can be secured while suppressing a decrease in sealing performance of the sealing layer 4 due to an indention being formed in the sealing layer 4. Thus, quality reliability is excellent, and light extraction efficiency can also be improved.

Note that, in the aforementioned description, the second surface 512 of the colored layer 5 is considered to be a lens surface, but the surface of the wall portion 6 in contact with the colored layer 5 may be considered to be a lens surface. Further, a boundary surface between the colored layer 5 and the wall portion 6 may be considered to be a lens surface.

1B. Second Exemplary Embodiment

A second exemplary embodiment will be described. Note that, in each following exemplification, a sign used in the description of the first exemplary embodiment is used for an element having the same function as that of the first exemplary embodiment, and each detailed description thereof will be appropriately omitted.

Figure 12:
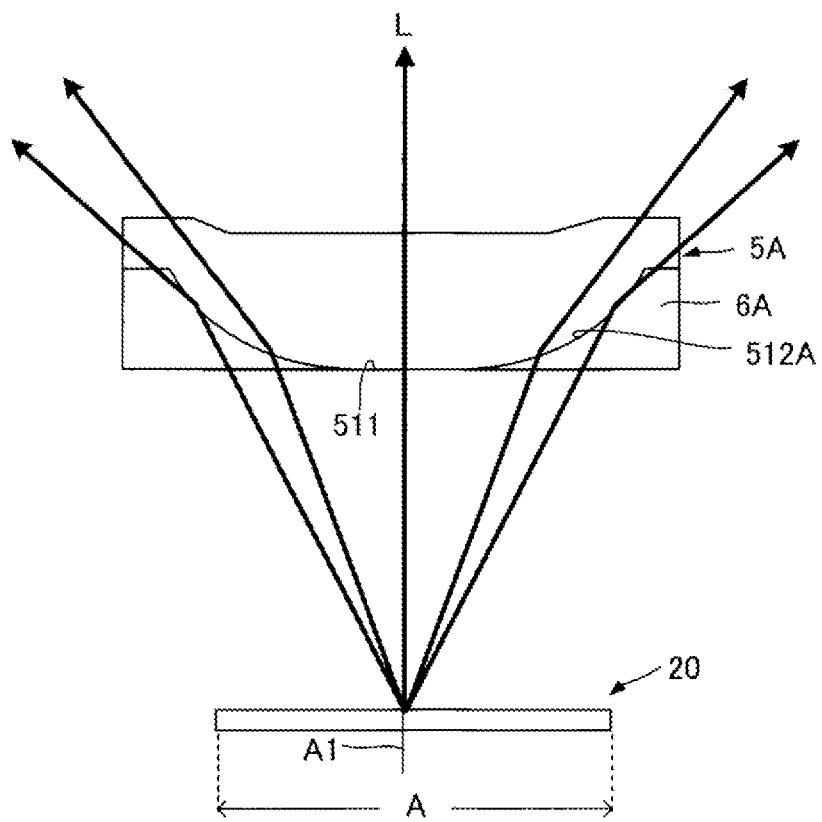
FIG. 12 is a diagram for illustrating a lens function of a colored layer according to a second exemplary embodiment.

FIG. 12 is a diagram for illustrating a lens function of a colored layer 5A according to the second exemplary embodiment. The second exemplary embodiment is the same as the first exemplary embodiment except that a first refractive index of a wall portion 6A according to the second exemplary embodiment is greater than a second refractive index of the colored layer 5A. By the first refractive index of the wall portion 6A being greater than the second refractive index of the colored layer 5A, light emitted from a light-emitting region A can diverge. Thus, a visual field angle characteristic of an electro-optical device 100 can be improved.

As illustrated in FIG. 12, light along a central axis A1 of light L emitted from the light-emitting region A is incident on a first surface 511 and is emitted from the colored layer 5A along the central axis A1. Further, light inclined with respect to the central axis A1 of the light L emitted from the light-emitting region A is incident on a second surface 512A, is refracted by the second surface 512A, and travels while being inclined away from the central axis A1. For this reason, the light L emitted from the light-emitting region A diverges due to a lens function of the colored layer 5A. Thus, a visual field angle characteristic can be improved.

Figure 13:
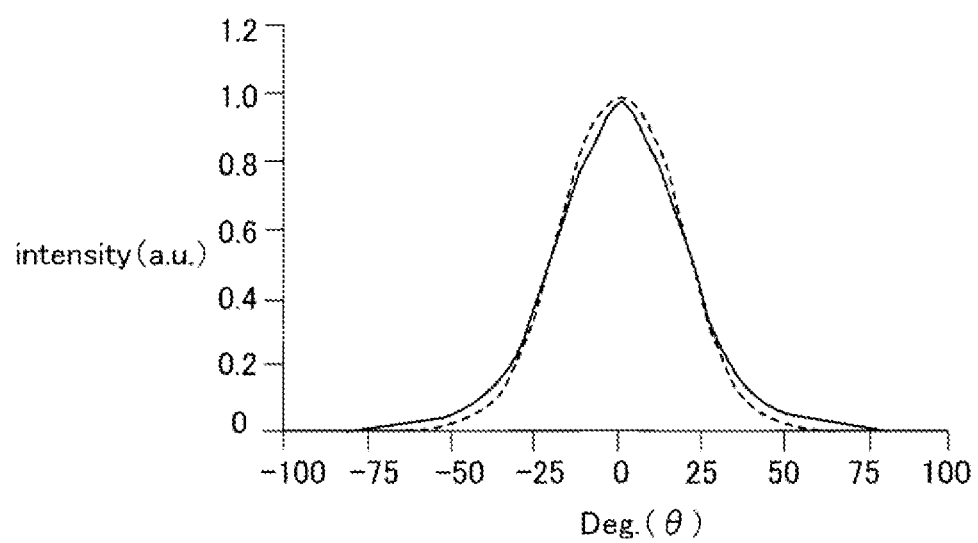
FIG. 13 is a simulation result of intensity of light according to the second exemplary embodiment.

FIG. 13 is a simulation result of intensity of light according to the second exemplary embodiment. A solid line in FIG. 13 is a result of a case in which the colored layer 5A includes the second surface 512A being a lens surface. A dashed line in FIG. 13 is a result of a case in which the colored layer 5A does not include the lens surface. As illustrated in FIG. 13, it can be seen that the colored layer 5A includes the second surface 512A being the lens surface, and thus light intensity is increased in a wider angular range as compared to a case in which the colored layer 5A does not include the lens surface. Thus, as can be seen from FIG. 13, the colored layer 5A includes the second surface 512A being the lens surface, and thus a visual field angle characteristic can be improved.

Further, similarly to the first exemplary embodiment, each end portion 612 is disposed in the light-emitting region A in plan view, and thus a divergence function of light by the second surface 512A can be enhanced. Further, the wall portion 6A includes an opening S6 corresponding to a sub-pixel P0 and surrounds the sub-pixel P0, and thus a divergence function of light can be enhanced. Similarly, by surrounding the light-emitting region A by the wall portion 6A, the divergence function of light can be enhanced.

According to the present exemplary embodiment described above, the second surface 512A of the colored layer 5A functions as a lens surface. For this reason, a lens function of the colored layer 5A can be secured while suppressing a decrease in sealing performance of a sealing layer 4 due to an indention being formed in the sealing layer 4. Thus, according to the present exemplary embodiment, quality reliability is excellent, and a visual field angle characteristic can also be improved. Particularly, the electro-optical device 100 according to the present exemplary embodiment has an excellent divergence effect, and is thus suitably used in a head-mounted display described later and the like, for example.

1C. Modification Example

Each of the exemplary embodiments exemplified in the above can be variously modified. Specific modification aspects applied to each of the embodiments described above are exemplified below. Two or more modes freely selected from exemplifications below can be appropriately used in combination as long as mutual contradiction does not arise.

In each of the exemplary embodiments, the light-emitting element 20 has the light resonance structure 29 having a different resonance wavelength for each color, but may not have the light resonance structure 29. Further, the electro-optical device 100 displays a full color image, but may display a monochrome image. In this case, for example, the electro-optical device 100 includes the light-emitting element 20 that emits any of wavelength regions of blue, green, and red. Further, the light-emitting element 20 may include a different light-emitting material for each sub-pixel P0. Further, the pixel electrode 23 may have light reflectability. In this case, the reflection layer 26 may be omitted. Further, although the common electrode 25 is common in the plurality of light-emitting elements 20, an individual cathode may be provided for each of the light-emitting elements 20.

In each of the exemplary embodiments, an array of the light-emitting regions A is a rectangle array, but is not limited thereto, and may be, for example, a Bayer array, a delta array, or a stripe array.

In each of the exemplary embodiments, a shape of the light-emitting region A is an octagon, but is not limited thereto, and may have another shape such as a square and a circle. However, by setting a shape as an octagon or a circle, lens performance of the colored layer 5 can be further enhanced than that in a case in which the colored layer 5 is a rectangle. Particularly, the lens performance of the colored layer 5 can be most enhanced by setting a shape as a circle.

In each of the exemplary embodiments, a case in which the red wavelength region is the first wavelength region, the blue wavelength region is the second wavelength region, and the green wavelength region is the third wavelength region is described as an example. However, for example, the blue wavelength region may be considered to be a first wavelength region, the green wavelength region may be considered to be a second wavelength region, and the red wavelength region may be considered to be a third wavelength region. In this case, the light-emitting region AB corresponds to a first light-emitting region, each of the light-emitting regions AG1 and AG2 corresponds to the second light-emitting region, and the light-emitting region AR corresponds to the third light-emitting region.

In the first exemplary embodiment, a part of the light emitted from the light-emitting region A is incident on the second surface 512 through the wall portion 6, but may be incident on the second surface 512 through the colored layer 5. This also applies to the second exemplary embodiment.

Figure 14:
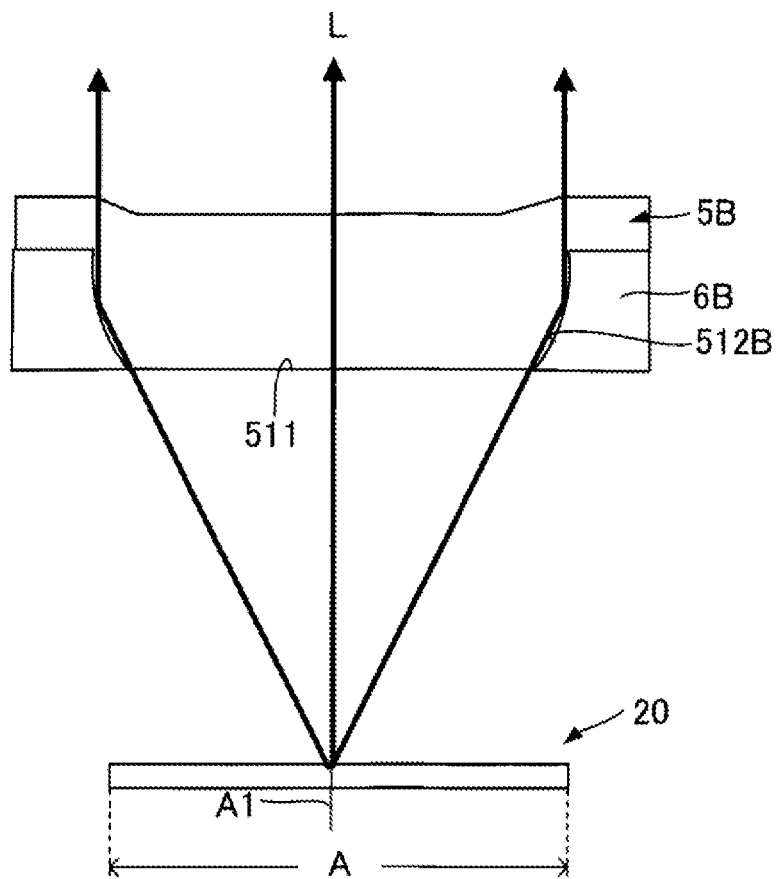
FIG. 14 is a schematic view illustrating a wall portion and a colored layer according to a modification example.

FIG. 14 is a schematic view illustrating a wall portion 6B and a colored layer 5B according to a modification example.

As illustrated in FIG. 14, a part of light emitted from a light-emitting region A may be incident on a second surface 512B through a colored layer 5B. In this case, the light is refracted by the second surface 512B, passes through the colored layer 5B again, and is emitted to the outside of the colored layer 5B. For example, an angle of inclination with respect to a central axis A1 of the second surface 512B and a curvature may result in an optical path illustrated in FIG. 14.

The "electro-optical device" is not limited to an organic EL device, and may be an inorganic EL device using an inorganic material or a μLED device.

2. Electronic Apparatus

The electro-optical device 100 according to the above-described exemplary embodiments is applicable to various electronic apparatuses.

2-1. Head-Mounted Display

Figure 15:
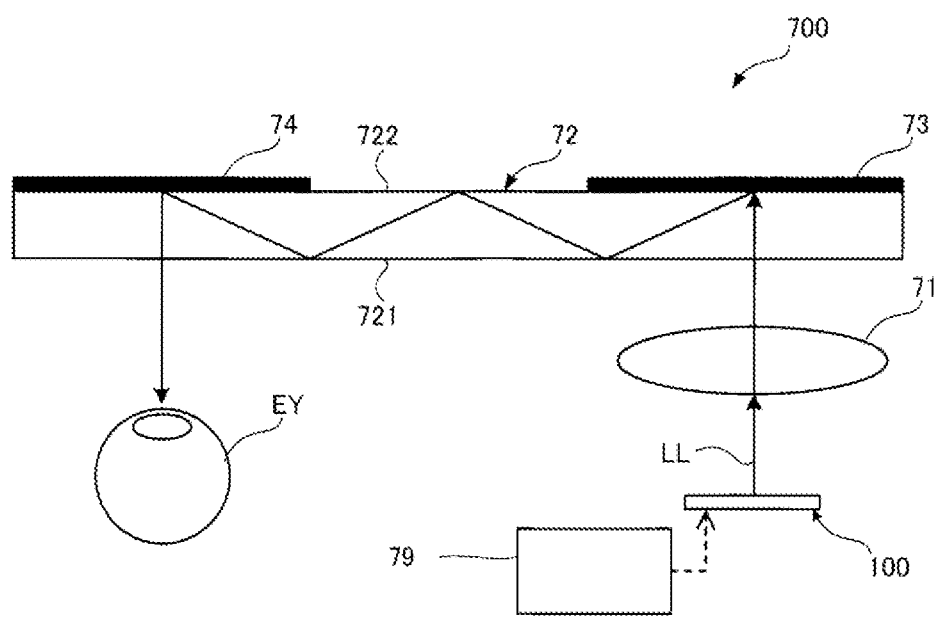
FIG. 15 is a plan view schematically illustrating a part of a virtual display apparatus as an example of an electronic apparatus.

FIG. 15 is a plan view schematically illustrating a part of a virtual display apparatus 700 as an example of an electronic apparatus. The virtual display apparatus 700 illustrated in FIG. 15 is a head-mounted display (HMD) mounted on a head of an observer and configured to display an image. The virtual display apparatus 700 includes the electro-optical device 100 described above, a collimator 71, a light guide 72, a first reflection-type volume hologram 73, a second reflection-type volume hologram 74, and a control unit 79. Note that light emitted from the electro-optical device 100 is emitted as image light LL.

The control unit 79 includes a processor and a memory, for example, and controls an operation of the electro-optical device 100. The collimator 71 is disposed between the electro-optical device 100 and the light guide 72. The collimator 71 collimates light emitted from the electro-optical device 100. The collimator 71 is constituted of a collimating lens or the like. The light collimated by the collimator 71 is incident on the light guide 72.

The light guide 72 has a flat plate shape, and is disposed so as to extend in a direction intersecting a direction of light incident via the collimator 71. The light guide 72 reflects and guides light therein. A light incident port on which light is incident and a light emission port from which light is emitted are provided in a surface 721 of the light guide 72 facing the collimator 71. The first reflection-type volume hologram 73 as a diffractive optical element and the second reflection-type volume hologram 74 as a diffractive optical element are disposed on a surface 722 of the light guide 72 opposite to the surface 721. The second reflection-type volume hologram 74 is provided closer to the light emission port side than the first reflection-type volume hologram 73. The first reflection-type volume hologram 73 and the second reflection-type volume hologram 74 have interference fringes corresponding to a predetermined wavelength region, and diffract and reflect light in the predetermined wavelength region.

In the virtual display apparatus 700 having such a configuration, the image light LL incident on the light guide 72 from the light incident port travels while being repeatedly reflected, and is guided to an eye EY of the observer, and thus the observer can observe an image constituted of a virtual image formed by the image light LL.

The virtual display apparatus 700 includes the above-described electro-optical device 100. The above-described electro-optical device 100 has excellent light extraction efficiency or an excellent viewing angle characteristic, and has excellent quality. Thus, the virtual display apparatus 700 having high display quality can be provided by including the electro-optical device 100.

2-2. Personal Computer

Figure 16:
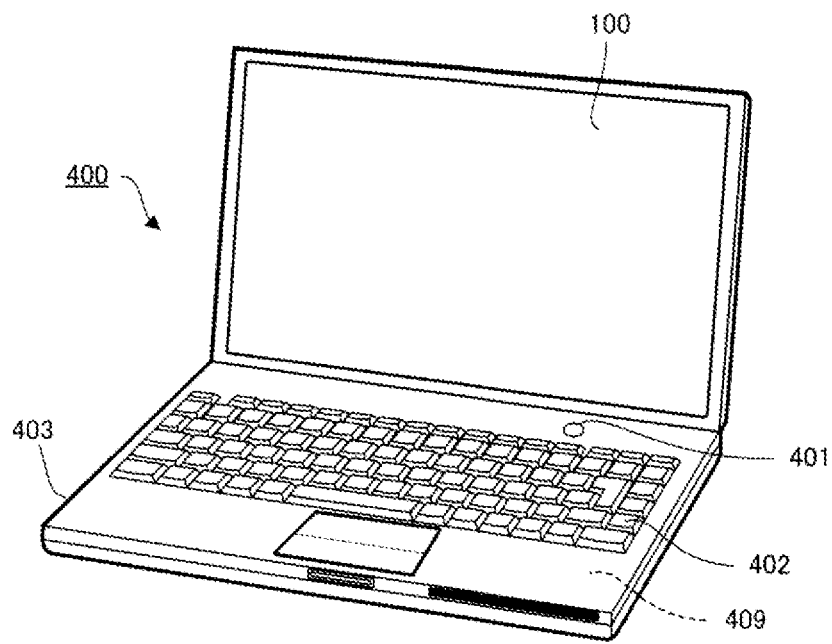
FIG. 16 is a perspective view illustrating a personal computer as an example of an electronic apparatus.

FIG. 16 is a perspective view illustrating a personal computer 400 as an example of the electronic apparatus in the present disclosure. A personal computer 400 illustrated in FIG. 16 includes the electro-optical device 100, a main body 403 provided with a power switch 401 and a keyboard 402, and a control unit 409. The control unit 409 includes a processor and a memory, for example, and controls an operation of the electro-optical device 100. The personal computer 400 has excellent light extraction efficiency or an excellent viewing angle characteristics, and has excellent quality. Thus, the personal computer 400 having high display quality can be provided by including the electro-optical device 100.

Note that examples of the "electronic apparatus" including the electro-optical device 100 include, in addition to the virtual display apparatus 700 illustrated in FIG. 15 and the personal computer 400 illustrated in FIG. 16, an apparatus arranged close to eyes such as a digital scope, a digital binocular, a digital still camera, and a video camera. Further, the "electronic apparatus" including the electro-optical device 100 is applied as a mobile phone, a smartphone, a Personal Digital Assistant (PDA), a car navigation device, and a vehicle-mounted display unit. Furthermore, the "electronic device" including the electro-optical device 100 is applied as illumination for illuminating light.

The present disclosure was described above based on the illustrated embodiments. However, the present disclosure is not limited thereto. In addition, the configuration of each component of the present disclosure may be replaced with any configuration that exerts the equivalent functions of the above-described embodiments, and to which any configuration may be added. Further, any configuration may be combined with each other in the above-described embodiments of the present disclosure.

What is claimed is:

1. An electro-optical device, comprising:
   a substrate;
   a colored layer;
   a first light-emitting element and a second light-emitting element disposed between the substrate and the colored layer in a thickness direction of the substrate;
   a wall portion disposed between the first light-emitting element and the second light-emitting element and the colored layer in the thickness direction and between the first light-emitting element and the second light-emitting element in plan view; and
   a sealing layer disposed between the first light-emitting element and the second light-emitting element and the colored layer in the thickness direction, wherein
   a first refractive index of the wall portion and a second refractive index of the colored layer are different from each other,
   the wall portion includes a first opening corresponding to the first light-emitting element and a second opening corresponding to the second light-emitting element and includes a recessed portion that is recessed inside the wall portion between a top portion that is thickest in the wall portion and an end portion that is thinnest in the wall portion, and
   the colored layer is in contact with the sealing layer though the first opening and the second opening and includes a curved surface that is in contact with recessed portion of the wall portion and protrudes toward the wall portion.

2. The electro-optical device according to claim 1, wherein
   the first refractive index is smaller than the second refractive index.

3. The electro-optical device according to claim 1, wherein
   the first refractive index is greater than the second refractive index.

4. The electro-optical device according to claim 1, wherein
   the wall portion includes a first end portion disposed in a region that overlaps the first light-emitting element, and a second end portion disposed in a region that overlaps the second light-emitting element, in plan view.

5. The electro-optical device according to claim 2, wherein
   the wall portion includes a first end portion disposed in a region that overlaps the first light-emitting element, and a second end portion disposed in a region that overlaps the second light-emitting element, in plan view.

6. The electro-optical device according to claim 3, wherein
   the wall portion includes a first end portion disposed in a region that overlaps the first light-emitting element, and a second end portion disposed in a region that overlaps the second light-emitting element, in plan view.

7. The electro-optical device according to claim 1, wherein
   a thickness of the wall portion is greater than or equal to ½ of a thickness of the colored layer.

8. The electro-optical device according to claim 3, wherein
   a thickness of the wall portion is greater than or equal to ½ of a thickness of the colored layer.

9. The electro-optical device according to claim 4, wherein
   a thickness of the wall portion is greater than or equal to ½ of a thickness of the colored layer.

10. The electro-optical device according to claim 7, wherein
    a thickness of the wall portion is smaller than a thickness of the colored layer, and
    the wall portion includes a top portion covered by the colored layer.

11. The electro-optical device according to claim 1, further comprising:
    a reflection layer disposed between the substrate and the first light-emitting element;
    a semi-transparent reflection layer disposed between the reflection layer and the colored layer; and
    a light resonance structure configured to resonate light emitted from the first light-emitting element between the reflection layer and the semi-transparent reflection layer.

12. The electro-optical device according to claim 1, wherein
    the first light-emitting element is surrounded by the wall portion in plan view, and
    the second light-emitting element is surrounded by the wall portion in plan view.

13. An electronic apparatus, comprising:
    the electro-optical device according to claim 1; and a control unit configured to control an operation of the electro-optical device.

14. An electro-optical device, comprising:
a substrate;
a colored layer;
a first light-emitting element and a second light-emitting element disposed between the substrate and the colored layer in a thickness direction of the substrate; and
a wall portion disposed between the first light-emitting element and the colored layer in the thickness direction and between the first light-emitting element and the second light-emitting element in plan view, wherein
a first refractive index of the wall portion and a second refractive index of the colored layer are different from each other, and
the colored layer includes a curved surface that is in contact with the wall portion and protrudes toward the wall portion,
wherein
the first refractive index is smaller than the second refractive index, and
a thickness of the wall portion is greater than or equal to ½ of a thickness of the colored layer.

15. An electro-optical device, comprising:
a substrate;
a wall portion disposed between two pixels adjacent to each other in plan view;
a colored layer having a second refractive index different from a first refractive index of the wall portion; and
a light-emitting layer disposed between the substrate and the colored layer, wherein
the colored layer includes a curved surface that is in contact with the wall portion and protrudes toward the wall portion,
wherein
the first refractive index is smaller than the second refractive index, and
a thickness of the wall portion is greater than or equal to ½ of a thickness of the colored layer.

* * * * *